United States Patent [19]

Fidalgo

[11] Patent Number: 5,598,032
[45] Date of Patent: Jan. 28, 1997

[54] HYBRID CHIP CARD CAPABLE OF BOTH CONTACT AND CONTACT-FREE OPERATION AND HAVING ANTENNA CONTACTS SITUATED IN A CAVITY FOR AN ELECTRONIC MODULE

[75] Inventor: Jean-Christophe Fidalgo, Gemenos, France

[73] Assignee: Gemplus Card International, Gemenos, France

[21] Appl. No.: 388,102

[22] Filed: Feb. 13, 1995

[30] Foreign Application Priority Data

Feb. 14, 1994 [FR] France ................... 94 01652

[51] Int. Cl.$^6$ ............... H01L 23/02; H01Q 1/38; H01Q 1/40; G06K 19/06
[52] U.S. Cl. ............ 257/679; 257/728; 235/492; 343/866; 343/873
[58] Field of Search ............... 340/572; 343/741–744, 343/787, 788, 702, 872, 873, 866; 257/679, 531, 728; 235/492, 493

[56] References Cited

U.S. PATENT DOCUMENTS

| | | | |
|---|---|---|---|
| 5,067,008 | 11/1991 | Yanaka et al. | 257/703 |
| 5,206,495 | 4/1993 | Kreft | 235/492 |
| 5,208,450 | 5/1993 | Uenishi et al. | 235/492 |

FOREIGN PATENT DOCUMENTS

| | | | |
|---|---|---|---|
| 0570062 | 11/1993 | European Pat. Off. . | |
| 2659767 | 9/1991 | France . | |
| 4105869 | 8/1992 | Germany | 235/492 |
| 0048395 | 2/1992 | Japan | 235/492 |
| 0321190 | 11/1992 | Japan | 235/492 |
| 0250529 | 9/1993 | Japan | 235/492 |
| 0076132 | 3/1994 | Japan | 235/492 |
| 8702806 | 5/1987 | WIPO . | |
| 8808592 | 11/1988 | WIPO . | |
| 9320537 | 10/1993 | WIPO . | |

*Primary Examiner*—Peter Toby Brown
*Attorney, Agent, or Firm*—Nilles & Nilles, S.C.

[57] ABSTRACT

A contact-free card and a method for the manufacture of such a card. The card comprises a card body, an electronic module having an integrated chip card and two contact zones, and an antenna connected to the contact zones of said module by two contact terminals, wherein said module furthermore has contact pads connected to said chip for a contact-using operation of said card. Said method has a step according to which a layer of the card body is negative-molded on the antenna and a cavity is made in the card body, revealing said contact terminals of the antenna, followed by a step according to which the electronic module is mounted in the cavity of the card body. The invention can be applied to the manufacture of contact-free cards, which may or may not be combined and designed, for example, for remote cash type of operations.

35 Claims, 4 Drawing Sheets

HYBRID CHIP CARD CAPABLE OF BOTH CONTACT AND CONTACT-FREE OPERATION AND HAVING ANTENNA CONTACTS SITUATED IN A CAVITY FOR AN ELECTRONIC MODULE

BACKGROUND OF THE INVENTION

1. Field of the Invention

The invention relates to a method for the manufacture of a no-contact or contact-free card (namely a card that operates without making contact) as well as to a contact-free card comprising a card body, an electronic module and, connected to said module, an antenna. Such cards are designed to carry out various operations such as, for example, debiting operations in public transport vehicles, notably in subway systems, banking operations, telephone communications or various identification operations. These operations are performed by means of a remote electromagnetic coupling between the electronic module of the card and a receiver apparatus or reader. The coupling can be done in read mode or in read/write mode.

In the form in which they are made at present, cards are portable objects with standardized dimensions. However, in the case of contact-free cards, the thickness of these portable objects is often greater. The usual ISO 7810 standard corresponds to a card with a standard format having a length of 85 mm, a width of 54 mm and a thickness of 0.76 mm. Each contact-free card has a card body constituted by an assembly of thermoplastic sheets and an electronic module containing an integrated circuit chip. An inductance coil type of antenna is connected to the chip.

2. Description of the Prior Art

There are known ways of making contact-free cards by the colamination technique. These methods entail the placing, between the two plates of a press, of a stack of thermoplastic sheets in the middle of which the contact-free electronic module is positioned, this contact-free electronic module being already connected to an antenna surrounding the module. The different thermoplastic sheets are then soldered by the application of pressure and temperature.

Owing to the differences between the expansion coefficients of the materials used, the combined action of the pressure and of the temperature generates a residual deformation on the surface of the card and below the electronic module. Zones of differential resistance to impacts and to twisting forces are created. The card obtained is not aesthetically satisfactory, unless the thickness is increased, which means that it is often not possible to obtain the above-mentioned standard thickness of 0.76 mm. The efficiency of such methods is therefore low. Furthermore, since the rejected cards already contain the electronic module and the coil, these methods are particularly costly.

Furthermore, there already exist methods for the making of contact-free cards in which a rectangular frame is deposited on a lower thermoplastic sheet. An electronic module, already connected to an antenna, is deposited within a cavity formed by said frame and said internal sheet, and a thermosetting resin is poured into this cavity, and then this cavity is covered with an upper thermoplastic sheet.

Cards made by such methods have an unaesthetic sinusoidal strip on the edge. Furthermore, the positioning of the module inside the card is done in just a very approximate fashion. It is therefore very difficult to add a contact interface to cards made by such methods.

The present invention is aimed at proposing a method for the manufacture of contact-free cards that overcomes the above-mentioned drawbacks and makes it possible, in particular, to easily obtain aesthetically pleasing, slim cards efficiently and at low cost, minimizing the lack of precision of the mounting of the the electronic module in the card body.

Another aim of the invention is the addition of a contact interface to contact-free cards in order to obtain a combined or hybrid card having two modalities of operation: contact-free operation and operation with contacts.

SUMMARY OF THE INVENTION

These aims as well as others that shall appear hereinafter are achieved firstly by means of a method for the manufacture of a contact-free or of a hybrid card comprising a card body, an electronic module having an integrated circuit chip and two contact zones, and an antenna connected to the contact zones of said module by means of two contact terminals, wherein said method has a step according to which a layer of the card body is negative-molded on the antenna and a cavity is made in the card body, revealing said contact terminals of the antenna, and a step according to which the electronic module is mounted in the cavity of the card body.

These aims as well as others that shall appear hereinafter are achieved secondly by means of a contact-free card comprising a card body, an electronic module having an integrated chip card and two contact zones, and an antenna connected to the contact zones of said module by means of two contact terminals, wherein said module furthermore has contact pads connected to said chip for a contact-using operation of said card.

The following description which is no way restrictive will enable a clearer understanding of ways in which the invention can be implemented.

BRIEF DESCRIPTION OF THE DRAWINGS

It is to be read with reference to the appended drawings, of which.

MORE DETAILED DESCRIPTION

Figure 1:
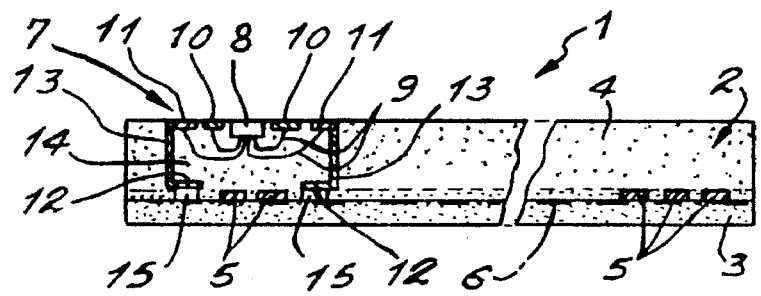
FIG. 1 shows a cross-sectional view of a hybrid contact-free card according to the invention obtained according to the method of the invention.

FIG. 1 shows a cross-sectional view of a hybrid contact-free card, obtained according to the method of the invention. This card is referenced 1 in its entirety. A card 1 such as this has the ability to work in two modes: without making contact and in making contact.

These hybrid cards are designed, for example, for remote cash operations in which units are deducted from them remotely when they pass in the vicinity of a terminal (contact-free operation), and in which they are recharged in a dispenser that is compatible with standard contact cards (operation with contacts).

Hybrid contact-free cards therefore have an interface with contacts comprising, for example, surface pads forming metallizations. These pads are connected to the chip with a view to carrying out either operations with contacts or contact-free operations.

In the present description, the term "contact-free card" shall be applied to a card working exclusively without making contact or else to a card having a hybrid operation.

A card 1 has a card body 2 formed by a lower thermoplastic sheet 3 and an upper thermoplastic sheet 4. It furthermore has an antenna 5 placed on top of the sheet 3. This antenna 5 may be embedded in a layer of bonder 6 indicated in dashes in FIG. 1.

The card 1 furthermore has a hybrid electronic module 7 located in the layer 4, above the antenna 5.

Figure 8:
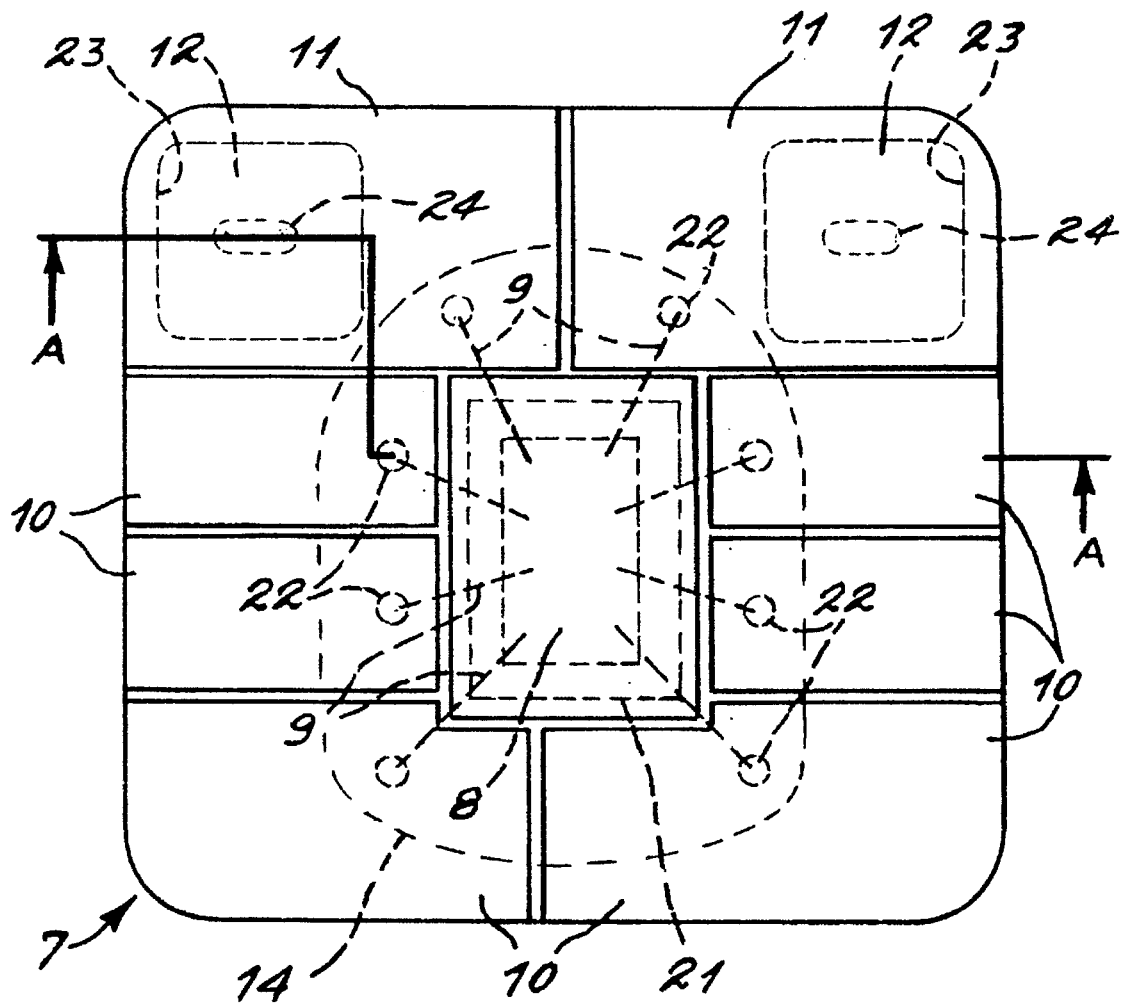
FIG. 8 shows a top view of a micromodule of a hybrid card according to the invention.
Figure 9:
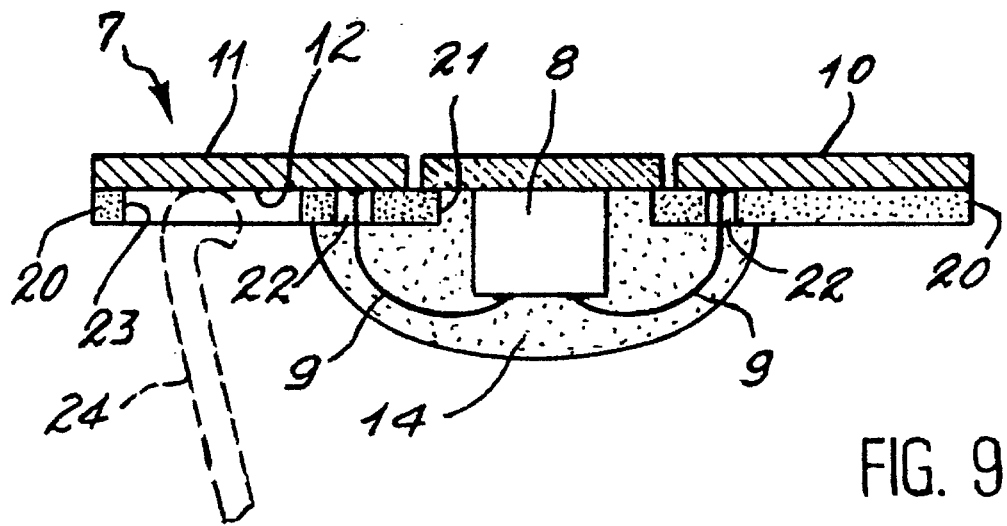
FIG. 9 shows a cross-section along A—A of the micromodule of a hybrid card according to the invention shown in FIG. 8.

This electronic module 7 is described with particular reference to FIGS. 8 and 9. It has an integrated circuit chip 8 electrically connected by means of conductive connective wires 9, directly to a set of metal pads 10 and 11 made for example of copper and forming metallizations. The pads 10 and 11, which are eight in number in one example, are placed above the chip 8 and are flush with the surface of the card 1. They are positioned on the card 1 so as to comply with the ISO standard 7816 defining the positioning of the contacts of a chip card. They are pasted, on their lower face, flat against a dielectric 20 which may be formed by glass/epoxy, polyester, polyimide, or any appropriate polymer. A connection of said pads is made by the wires 9, through wells 22 made in the dielectric 20.

Furthermore, two apertures 23 are made in the dielectric located above the pads 11. These apertures 23 make it possible to set up a connection of the pads 11 with two terminals of the antenna 5. The chip 8 is bonded into a window 21 made in the dielectric 20. Only the pads 11, of which there are two (for example, located on), the periphery of the metallizations get connected to the antenna 5 via two contact zones 12. In the example of the FIGS. 8 and 9, the contact zones 12 are made by the under surface of the pads 11. They are located on the lower face of the pads connected to the chip. When such is not the case, the pads 11 are connected to two lower metallic contact zones 12 of the module 7 by conductive wires (not shown) or else by a conductive tape that will be positioned vertically on lateral faces 13 of the module 7, folded at its ends, with a view to the efficient connection of the pads 11 and the zones 12. Finally, the module 7 has a protection resin 14 in which different above-mentioned elements, notably the chip 8 and the connection wires 9, are fixedly set.

The contact zones 12 of the module 7 are in electrical contact with two contact terminals 15 of the antenna 5. This contact may be a direct one, set up by conductive means of a conductive resin or by any other means and, notably, by means of a metal tongue working with a spring effect 24.

Figure 2:
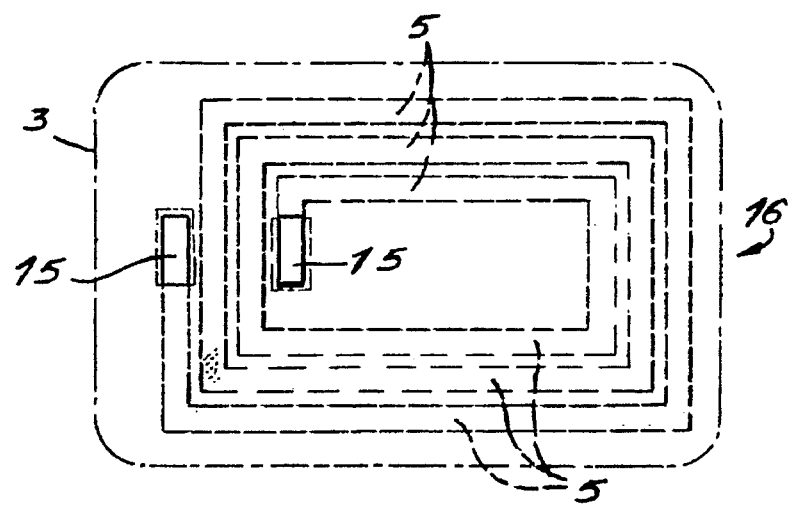
FIG. 2 shows a top view of a step of the method of the invention in which an antenna is placed on a thermoplastic sheet of the card body of a card according to the invention.
Figure 3:
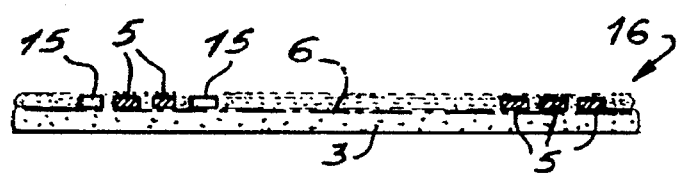
FIG. 3 shows a cross-sectional view of the above-mentioned step as well as the antenna positioned on a thermoplastic sheet of the card body of the invention.

In order to make a card such as this, the method of the invention proposes the prior positioning of the antenna 5 on the thermoplastic sheet 3 so as to obtain a unit 16 formed by the thermoplastic sheet and the antenna. This first step is illustrated in FIGS. 2 and 3.

The antenna 5 is formed of a dielectric that is metallized or pasted flat against metal, a metal sheet or a coil of wires. It can be made by different methods, notably and respectively by being chemically etched, by stamping or by the coiling of a wire. It can be formed by the deposition of an adhesion-promoting product on the thermoplastic sheet 3 by a silk-screen printing process and then metallization by chemical deposition. In FIG. 2, the antenna 5 is positioned on a face of the sheet 5 in the form of a spiral 5 with three turns whose two ends, namely the contact terminals 15, are localized in a position where they face each other and are in the vicinity of each other, with one within said spiral and the other on the outside said spiral. The antenna 5 can have any geometrical configuration. The number of turns is given solely by way of an indication. Furthermore, the sheet can be metallized on both faces and, in this case, there may be turns on the other face. For this embodiment, metallized via holes are made according to dual-face printed circuit technology. It is then possible to get rid of the constraint wherein all the turns have to be made to pass between the contact terminals 15. Rather than having dual-face circuits it is possible, by several successive silk-screen printing operations, to define multilayer turns. Furthermore, should the antenna 5 be a microwave antenna, its configuration may be rectangular with two faces. In this case, the microwave antenna has a copper band on its upper face. In addition, a metallized via hole electrically connects the lower face to the upper face. One end of the copper band as well as the via hole may, in this example of a microwave antenna, constitute the contact terminals 15. Irrespectively of its geometrical configuration, the antenna 5 should be capable of being made in the thickness of the card 1. By its external contour, it substantially and preferably matches the external contours of the sheet 3. Its range and its reception capacities, which depend on the surface area of magnetic flux that it covers, will thus be maximal. This is why the sprial 5 is, like the card 1, rectangular.

The thermoplastic sheet 3 has substantially the length and width of the card to be obtained. It will in fact be slightly smaller so that it can be positioned in a mold with a certain lateral clearance. Its thickness is smaller: it is about 180 micrometers for a standard card corresponding to the ISO 7810 standard. This sheet 3 is made, for example, of PVC (polyvinyl chloride), PC (polycarbonate), ABS (acrylonitrile-butadiene-styrene), PET (polyethylene), PETG (polyethylene terephtalate glycol), PVDF (polyvinylidene fluoride) or any other thermoplastic film having equivalent properties.

The antenna 5, positioned on the thermoplastic sheet 3, may be fixed by bonding.

The antenna 5 may be advantageously coated and embedded in thermoactivable bonder referenced 6 in FIG. 3. The fastening of the antenna 5 to the sheet 3 is thus improved. In this case, the contact terminals 11 of the antenna 5 will not be coated. This will enable them to be connected with the module 7. In a certain number of cases, this coating will not be necessary, the adhesion being then obtained, for example, by the softening of the thermoplastic material that arises at the temperatures of immplementation of the invention considered.

According to another step of the method of the invention illustrated in FIGS. 4 to 7, the entire unit 16 formed by the thermoplastic sheet and the antenna is covered, except for the contact terminals 15, of the thermoplastic layer 4.

This step is advantageously constituted by negative molding. The material used for the making of the layer 4 will preferably be ABS, PC, ABS/PC, PET or a polyamide. The mold used will then advantageously have a device enabling the set 16 to be fixed so that, during the injection of the thermoplastic designed to form the layer 4, the sheet 3 remains perfectly in position, attached to one of the faces of the mold. This device is formed, for example, by a suction pump connected to small holes that are directly pierced into the face of the mold referred to here above.

Figure 4:
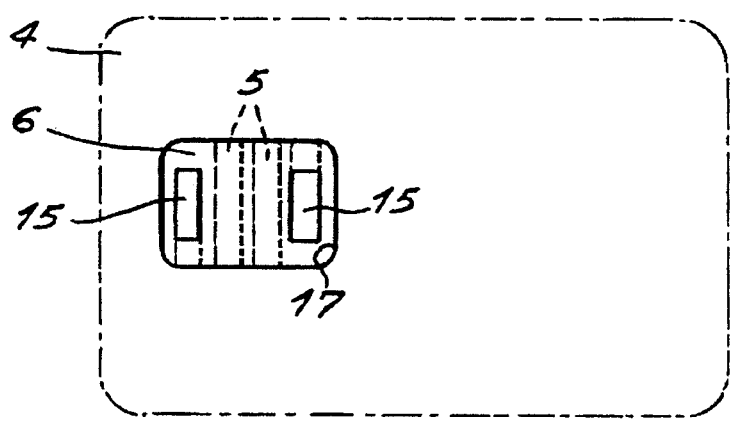
FIG. 4 shows a top view of a step of the method of the invention in which a thermoplastic layer is deposited on a unit formed by a thermoplastic sheet and an antenna according to a first embodiment of a card of the invention.
Figure 5:
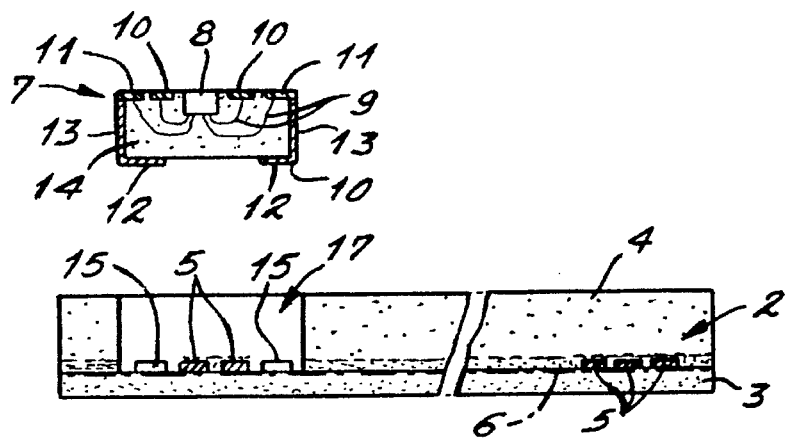
FIG. 5 illustrates the above-mentioned step in a cross-section as well as a step for mounting the module in the cavity of a hybrid contact-free card of the invention.
Figure 6:
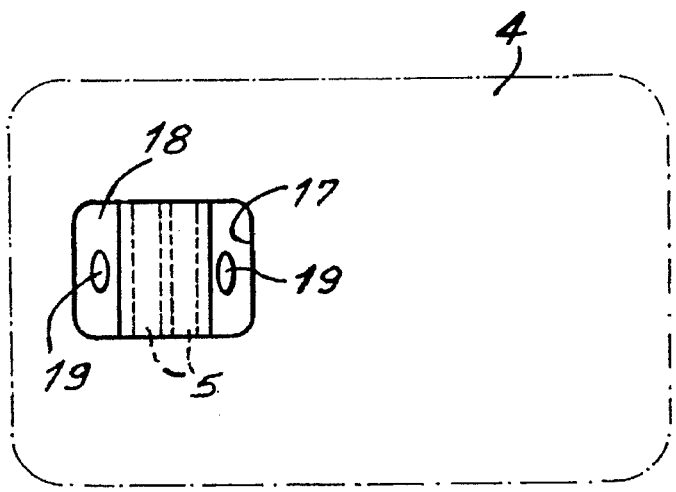
FIG. 6 illustrates a top view of a step of the method according to the invention in which a thermoplastic sheet is deposited in a unit formed by a thermoplastic sheet and an antenna, according to a second embodiment of the invention.

Furthermore, the mold used has one or more cores that cover the contact terminals 15 of the antenna 5 and that reserve the place of the module 7. In this way, there is formed a cavity 17 (FIGS. 4 to 7) whose dimensions are close to those of the module 7. This core exerts sufficiently high pressure on the contact terminals 15. These contact terminals will not be covered by the layer 4, and they appear naturally at the bottom of the cavity 17. The cavity 17 may have any relief depending on the conformation of the core used. The FIGS. 4 and 6 show two types of rectangular-sectioned cavities that are particularly suited to receiving parallelepiped-shaped modules. However, these cavities 17, shown in FIGS. 4 and 7, have a differently shaped recess. Indeed, the cavity 17 shown in FIG. 5 has a flat-bottomed parallelepiped recess while the cavity 17 shown in FIG. 7 shows a flat shoulder or flat feature 18, crossed by two oblong-sectioned apertures 19 that open into the contact terminals 15.

According to yet another step of the method of the invention, the electronic module 7 is mounted in the cavity 17 of the card body 2. This step is illustrated in FIGS. 5 and 7. It will be noted, however, that in the case of the making of a combined contact-free card, it is particularly difficult to position the contact interface that is connected to the contact-free module. Indeed, the contact-free module is often not mounted in the card body with a degree of precision that is sufficient to enable the appropriate and automated connection of the contact interface. Of course, the invention is not limited to the mounting of an already complete electronic module into the cavity 17. For example, it is possible to carry out a different procedure by mounting the bare chip 8 in the cavity 17. The two contact zones 12 will then be connected to the contact zones 15 of the antenna 5 before the mounting of the chip 8. The connections to the pads 10 and 11, which are made at the end, will be done after the mounting of the chip 8, so that the ends of the conductive wires are ready to receive the metallizations.

In FIG. 5, the module 7 is parallelepiped-shaped. The cavity 17, which is complementary to it, has the contact terminals 15 at its bottom, at opposite sides. During the mounting of the module 7 in the cavity 17, the two contact zones 12 of the module 7 come directly into contact with the contact terminals 15 of the antenna 5. The module 7 is fixed to the bottom of the cavity 17, for example by a cyanocrylate bonder or a thermoactivable bonder or a cold adhesive and at the position of the connections, for example by some drops of conductive bonder based on an epoxy or a silver-charged acrylate for example.

Figure 7:
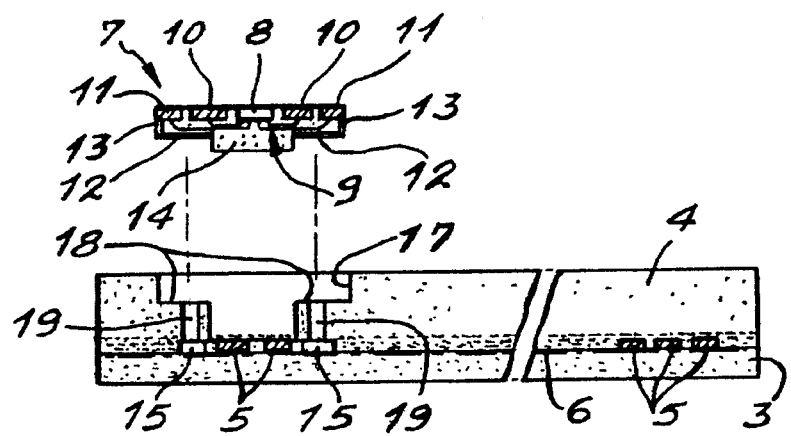
FIG. 7 illustrates the above-mentioned step in a cross-section as well as a step for mounting the module in a cavity of a card of the invention.
Figure 7A:
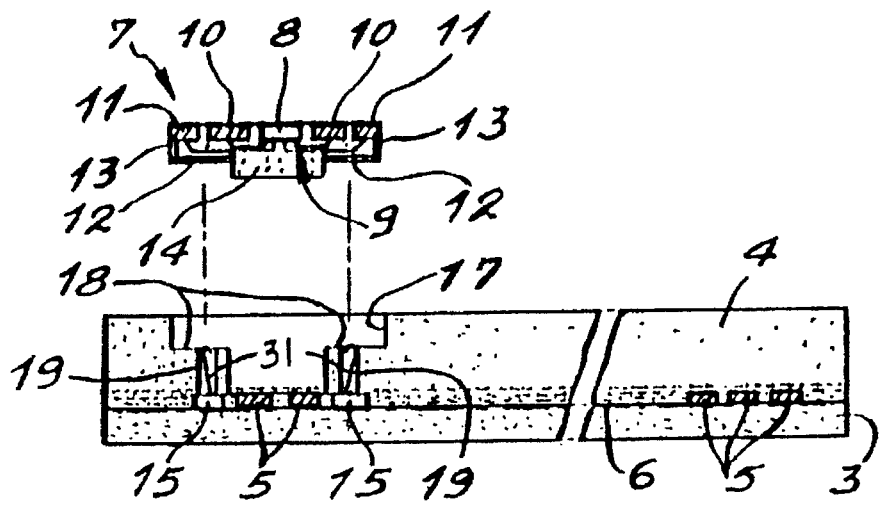
FIGS. 7A and 7B illustrate specific embodiments using metal tongues and metal springs, respectively, for making connections to the module.
Figure 7B:
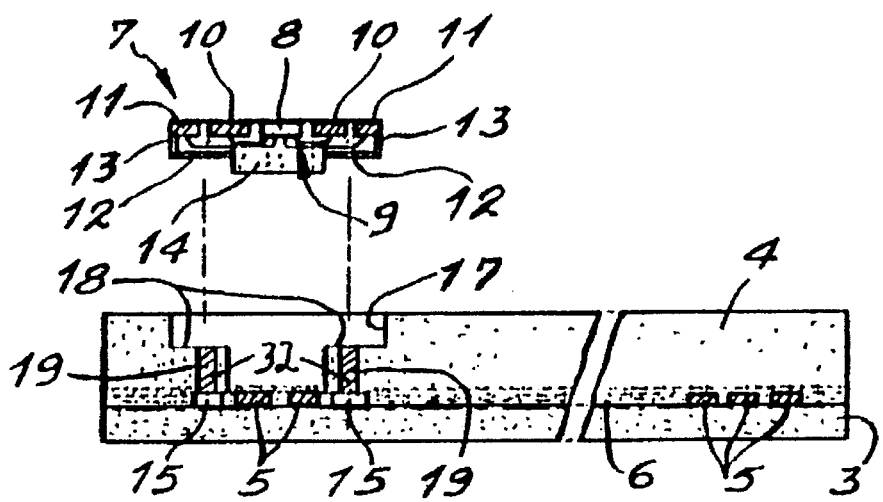

In FIG. 7, the module 7 has a standard conformation. The contact zones 12 of the module 7 are positioned in the upper part of this module, close to the metallizations. The vertical lateral faces are small as compared with the height of the module 7. In one example, the contact zones are formed by the back of the metallization grid that leads to the making of the metallic connections. During the mounting of the module 7 in the cavity 17, the contact zones 12 of the module 7 will lie on the plane 18. In order to provide an electrical link between these zones 12 and the terminals 15, the apertures 19 are filled with conductive polymer such as a soldering compound or a conductive bonder. It is also possible to place metal tongues 31 (see FIG. 7A) 32 (see FIG. 7B) or metal springs in the apertures 19. The module 7 will be fixed in the cavity 17 by a bonder based, for example, on cyanoacrylate or else by a cold or thermoactivable adhesive.

What is claimed is:

1. A hybrid chip card comprising
an electronic module having
an integrated circuit chip,
contact pads connected to said integrated circuit chip for a contact-using operation of said card, and
first and second contact zones;
a card body, the card body having a cavity formed therein for holding the electronic module, and the cavity opening out on a face of the card body for receiving the electronic module; and
an antenna, the antenna having first and second contacts situated in the cavity, and the antenna being connected to said first and second contact zones of said electronic module via the first and second contacts.

2. A card according to claim 1, wherein the first and second contact zones of the electronic module are located on lower faces of respective contact pads connected to the integrated circuit chip.

3. A hybrid chip card according to claim 2, wherein the first and second contact zones are connected to the integrated circuit chip.

4. A card according to claim 1, wherein the contact pads are flush with the surface of the card.

5. A card according to claim 1, wherein the first and second contact zones are connected to the first and second contacts of the antenna via first and second intermediary conductors.

6. A hybrid chip card according to claim 5, wherein the first and second intermediary conductors are both one of metal tongues and metal springs.

7. A hybrid chip card according to claim 5, wherein the first and second intermediary conductors are both formed of a conductive resin.

8. A hybrid chip card according to claim 5, wherein cavity has a flat shoulder, wherein first and second apertures extend through the flat shoulder and open into contacts, and wherein the first and second intermediary conductors are located in the apertures.

9. A hybrid chip card according to claim 1, wherein the first and second contacts are terminal contacts.

10. A hybrid chip card according to claim 1, wherein the antenna is in the shape of a spiral, the first contact being on the inside of the spiral, and the second contact being on the outside of the spiral.

11. A hybrid chip card according to claim 1, wherein the antenna is entirely coated and embedded in a bonder except at the location of the first and second contacts.

12. A hybrid chip card according to claim 1, wherein the cavity has a bottom and wherein the first and second contacts appear at the bottom of the cavity.

13. A hybrid chip card according to claim 1, wherein the cavity has dimensions which substantially match those of the electronic module.

14. A hybrid chip card according to claim 1, wherein the cavity has a flat-bottomed parallelepiped recess.

15. A hybrid chip card according to claim 1, wherein the cavity has a flat shoulder, and wherein the first and second apertures extend through the flat shoulder and open into contacts.

16. A hybrid chip card according to claim 1, wherein the first and second contact zones are connected to the integrated circuit chip.

17. A hybrid chip card for communicating with first and second chip card readers, the hybrid chip card comprising:
   an electronic module, the electronic module further including
      an integrated circuit chip,
      a plurality of contact pads connected to the integrated circuit chip, the contact pads defining a first means for communicating with the first chip card reader;
      first and second contact zones, the first contact zone being located on a lower face of a first one of the plurality of contact pads, and the second contact zone being located on a lower face of a second one of the plurality of contact pads,
   a card body, the card body having a cavity formed therein for holding the electronic module, and the cavity opening out on a face of the card body for receiving the electronic module; and
   an antenna, the antenna being connected to the first and second contact zones of the electronic module, and the antenna defining a second means for communicating with the second chip card reader.

18. A hybrid chip card according to claim 17, wherein the contact pads are flush with the surface of the hybrid chip card.

19. A hybrid chip card according to claim 17, wherein the card body further comprises a thermoplastic sheet, and wherein the antenna is disposed on an outer surface of the thermoplastic sheet.

20. A hybrid chip card according to claim 19, wherein the antenna is in the shape of a spiral, wherein the antenna further comprises first and second contacts, wherein the first contact is on the inside of the spiral, wherein the second contact is on the outside of the spiral, and wherein the first and second contact terminals connect the antenna to the first and second contact zones of the electronic module.

21. A hybrid chip card according to claim 20, wherein the first and second contacts are disposed directly below the electronic module.

22. A hybrid chip card according to claim 17, further comprising a thermoactivable bonder, the thermoactivable bonder forming a coating of the antenna.

23. A hybrid chip card according to claim 20, wherein the antenna comprises first and second contacts, and wherein the first and second contact zones are connected to the first and second contacts of the antenna via first and second intermediary conductors.

24. A hybrid chip card according to claim 23, wherein the first and second intermediary conductors are both one of metal tongues and metal springs.

25. A hybrid chip card according to claim 23, wherein the first and second intermediary conductors are both formed of a conductive resin.

26. A hybrid chip card according to claim 23, wherein the cavity has a flat shoulder, wherein first and second apertures extend through the flat shoulder and open into contacts and wherein the first and second intermediary conductors are located in the apertures.

27. A hybrid chip card according to claim 17, wherein the antenna comprises first and second contacts, and wherein the first and second contacts are terminal contacts.

28. A hybrid chip card according to claim 17, wherein the antenna is in the shape of a spiral, wherein the antenna further comprises first and second contacts, wherein the first contact is on the inside of the spiral, and wherein the second contact is on the outside of the spiral.

29. A hybrid chip card according to claim 17, wherein the antenna comprises first and second contacts, and wherein the antenna is entirely coated and embedded in a bonder except at the location of the first and second contacts.

30. A hybrid chip card according to claim 17, wherein the antenna comprises first and second contacts, wherein the cavity has a bottom, and wherein the first and second contacts appear at the bottom of the cavity.

31. A hybrid chip card according to claim 17, wherein the cavity has dimensions which substantially match those of the electronic module.

32. A hybrid chip card according to claim 17, wherein the cavity has a flat-bottomed parallelepiped recess.

33. A hybrid chip card according to claim 17, wherein the cavity has a flat shoulder, and wherein first and second apertures extend through the flat shoulder and open into contacts.

34. A hybrid chip card according to claim 17, wherein the first and second contact zones are connected to the integrated circuit chip.

35. A hybrid chip card according to claim 17, wherein the antenna comprises first and second contacts, wherein the antenna is connected to the first and second contact zones via the first and second contacts, and wherein the first and second contacts are situated in the cavity.

* * * * *